United States Patent
Dodsworth

(10) Patent No.: US 6,459,043 B1
(45) Date of Patent: Oct. 1, 2002

(54) FLEXIBLE CIRCUIT WITH ELECTROSTATIC DAMAGE LIMITING FEATURE AND METHOD OF MANUFACTURE

(75) Inventor: Robert S. Dodsworth, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/823,220

(22) Filed: Mar. 29, 2001

(51) Int. Cl.[7] .................................................. H05K 1/03
(52) U.S. Cl. ..................... 174/254; 174/261; 360/245.9; 361/772
(58) Field of Search ................................. 174/254, 257, 174/261; 360/245.9; 361/772

(56) References Cited

U.S. PATENT DOCUMENTS

| | | | |
|---|---|---|---|
| 4,231,154 A | 11/1980 | Gazdik et al. ................. 29/840 |
| 4,383,728 A | 5/1983 | Litington .................... 350/1.7 |
| 4,400,410 A | 8/1983 | Green et al. .................. 427/39 |
| 4,480,288 A | 10/1984 | Gazdik et al. ............... 361/398 |
| 4,504,410 A | 3/1985 | Hempel et al. .............. 252/358 |
| 4,576,964 A | 3/1986 | Eggler et al. ................ 514/546 |
| 4,698,256 A | 10/1987 | Giglia et al. ................. 428/216 |
| 4,746,538 A | 5/1988 | Mackowski ................... 427/38 |
| 4,809,876 A | 3/1989 | Tomaswick et al. ........ 220/458 |
| 4,914,551 A | 4/1990 | Anschel et al. ............. 361/389 |
| 5,227,008 A | 7/1993 | Klun et al. .................. 156/630 |
| 5,401,913 A | 3/1995 | Gerber et al. ................ 174/264 |
| 5,465,186 A | 11/1995 | Bajorek et al. ............. 360/113 |
| 5,508,071 A | 4/1996 | Banholzer et al. ......... 428/34.4 |
| 5,508,092 A | 4/1996 | Kimock et al. ............. 428/216 |
| 5,559,367 A | 9/1996 | Cohen et al. .................. 267/77 |
| 5,643,343 A | 7/1997 | Selifanov et al. ............. 51/306 |
| 5,707,409 A | 1/1998 | Martin et al. .................. 51/295 |
| 5,710,682 A | 1/1998 | Arya et al. .................. 360/106 |
| 5,737,837 A * | 4/1998 | Inaba .......................... 29/884 |
| 5,761,009 A | 6/1998 | Hughbanks et al. ........ 360/113 |
| 6,046,886 A | 4/2000 | Himes et al. ............... 360/104 |
| 6,049,041 A * | 4/2000 | Yoshioka et al. ...... 174/117 FF |
| 6,125,015 A | 9/2000 | Carlson et al. .......... 360/245.9 |
| 6,316,734 B1 * | 11/2001 | Yang .......................... 174/256 |

OTHER PUBLICATIONS

U.S. patent application Ser. No. 09/519,682, Rui Yang, filed Mar. 7, 2000, Flexible Circuits with Static Discharge Protection and Process for Manufacture.

* cited by examiner

Primary Examiner—Albert W. Paladini
(74) Attorney, Agent, or Firm—Darla P. Fonseca

(57) ABSTRACT

A flexible circuit incorporating electrostatic discharge (ESD) limiting features and being suitable for use in the fabrication of hard disk drives for computer applications. Conductive polymer strips are implemented to enhance the static dissipative characteristics of the flexible circuit and to protect magnetorestistive (MR) heads of a hard disk drive (HDD) from damage during the manufacture of the head gimbal assembly (HGA) of the HDD.

7 Claims, 4 Drawing Sheets

FLEXIBLE CIRCUIT WITH ELECTROSTATIC DAMAGE LIMITING FEATURE AND METHOD OF MANUFACTURE

FIELD OF THE INVENTION

The present invention relates to flexible circuits incorporating electrostatic discharge (ESD) limiting features and designed for use in the fabrication of hard disk drives for computer applications. More specifically, the invention relates to a flexible circuit having a conductive polymer strip which is intended to enhance static dissipative characteristics and to protect the magnetorestistive (MR) heads of a hard disk drive (HDD) from damage during the manufacture of the head gimbal assembly (HGA) of the HDD.

BACKGROUND OF THE INVENTION

Flexible circuits are circuits that are formed on flexible dielectric substrates including various polymeric materials, e.g., polyimide and the like. The circuits may have one or more conductive layers as well as circuitry on one of the major surfaces or on both major surfaces. The circuits often include additional functional layers, e.g., insulative layers, adhesive layers, encapsulating layers, stiffening layers and the like. Flexible circuits are typically useful for electronic packages where flexibility, weight control and the like are important. In many high volume situations, flexible circuits also provide cost advantages associated with efficiency of the manufacturing process employed.

Polymeric films, such as those used as substrates in flexible circuits, tend to be good electrical insulators and exhibit a propensity towards the generation of static electrical charges. One particular form of this phenomenon is known as tribocharging in which contact between dissimilar dielectric materials can result in the accumulation of a static charge at the surface of the flexible circuit. Tribocharging may occur even in the normal handling and bending of the flexible circuit during the manufacture of a hard disk drive. Static charges accumulated in this manner can release a sufficient amount of energy to damage the material balance in the thin (10 Å to 50 Å) MR layer which reduces or destroys the sensing properties of the read head.

U.S. Pat. No. 4,914,551 discloses circuits as provided on flexible dielectric materials. U.S. Pat. No. 4,231,154 discloses a flexible circuit with conductive traces on one or both major surfaces. U.S. Pat. No. 4,480,288 discloses flexible circuits with circuitry on both major surfaces. U.S. Pat. No. 5,401,913 discloses a multilayer flexible circuit including multiple flexible circuits stacked relative to one another and interconnected using metalized through-holes commonly referred to as vias. All of these references disclose various aspects of flexible circuits, but none of them make mention of features designed to enhance static charge dissipative characteristics and to minimize damage due to electrostatic discharge in devices which use these flexible circuits.

U.S. Pat. No. 5,465,186 discloses a magnetorestistive (MR) sensor element in which the conductive leads are shorted together to provide a low resistance conductive path bypassing the MR element and thereby minimizing electrical current through the MR sensing element during discharge of static electrical charge. These leads may be shorted together by soldering or by a twisted conductor pair prior to the assembly of the hard disk drive. This short is subsequently removed prior to placing the MR head into operation in the magnetic storage system. U.S. Pat. No. 5,710,682 discloses an MR head featuring a shorting bar which connects the wire leads in the MR head prior to installation in a disk drive. When properly installed, the MR head is supported by an air bearing or the disk itself to prevent contact between the exposed MR leads and the shorting bar. U.S. Pat. No. 5,761,009 discloses a magnetorestistive read head having a "parasitic shield" providing an alternative path for currents associated with sparkovers, thus preventing such currents from damaging the read head. The parasitic shield is provided in close proximity to a conventional magnetic shield. As charges accumulate on the conventional shield, current will flow to the parasitic shield at a lower potential than would be required for current to flow between the conventional shield and the sensor element. U.S. Pat. No. 6,125,015 discloses a head gimbal assembly with a flex circuit featuring ESD protection, namely a thin seed layer formed on the underside of the substrate. The seed layer may be of nickel (Ni), chromium (Cr) or other material which may be sputter deposited on the back side of the substrate to reduce static charge buildup. All of these references disclose various techniques for limiting the accumulation of electrostatic charge and damage to magnetorestistive (MR) heads for hard disk drives, but none make mention of the use of flexible circuits featuring a strip of conductive polymer to enhance static charge dissipative characteristics and to prevent damage from ESD to hard disk drives.

Conductive polymers, conductive polymer coatings and uses for them are also known. These coatings possess a number of desirable properties including electrical conductivity, optical clarity and scratch resistance. Various formulations are generally applied to glass plates or other substrates by spraying, dipping or spin coating techniques. However, conductive polymers applied using these techniques generally change the dielectric properties of an entire surface of the substrate. These application techniques are generally not suitable for creating a conductive strip on a selective portion of a substrate and, more specifically, have not been applied to enhance the static charge dissipative characteristics of flexible circuits used in magnetorestistive heads for hard disk drives.

Therefore, what is needed is a flexible circuit construction that permits static charges to be controllably and reliably dissipated from a surface of the circuit such that the potential damage from electrostatic discharge (ESD) to electrical components connected to the circuit is reduced.

SUMMARY OF THE INVENTION

The present invention is a flexible circuit incorporating electrostatic discharge (ESD) limiting features and designed for use in the fabrication of hard disk drives for computer applications. In accordance with one embodiment of the present invention, a conductive polymer strip is disposed across at least two of the conductive elements of the flexible circuit to reduce the accumulation of static electrical charges and to balance electrical potential across all conductive leads. The conductive polymer strip is preselected to have a high enough resistance to prevent shorting when the circuit is in use while also permitting a desired amount of charge leakage over time when the circuit is not in use. A conductive strip having a resistance ranging from about $10^4$ to about $10^9$ ohms, and preferably about $0.5 \times 10^6$ to about $1.5 \times 10^6$ ohms, will not short the circuit when in use and will equalize the static charge across the leads before discharge occurs and further continues to balance the voltages should any discharge occur. By creating this tightly controlled conductive path between the MR leads, it is possible to significantly reduce the likelihood of damage by ESD to an MR head during the assembly of a hard disk drive.

BRIEF DESCRIPTION OF THE DRAWINGS

The nature of the present invention, both as to its structure and operation, may be better understood by reference to the following detailed description and the accompanying drawings, in which like reference numerals designate like parts, and in which.

DETAILED DESCRIPTION OF THE PREFERRED EMBODIMENTS

Figure 1:
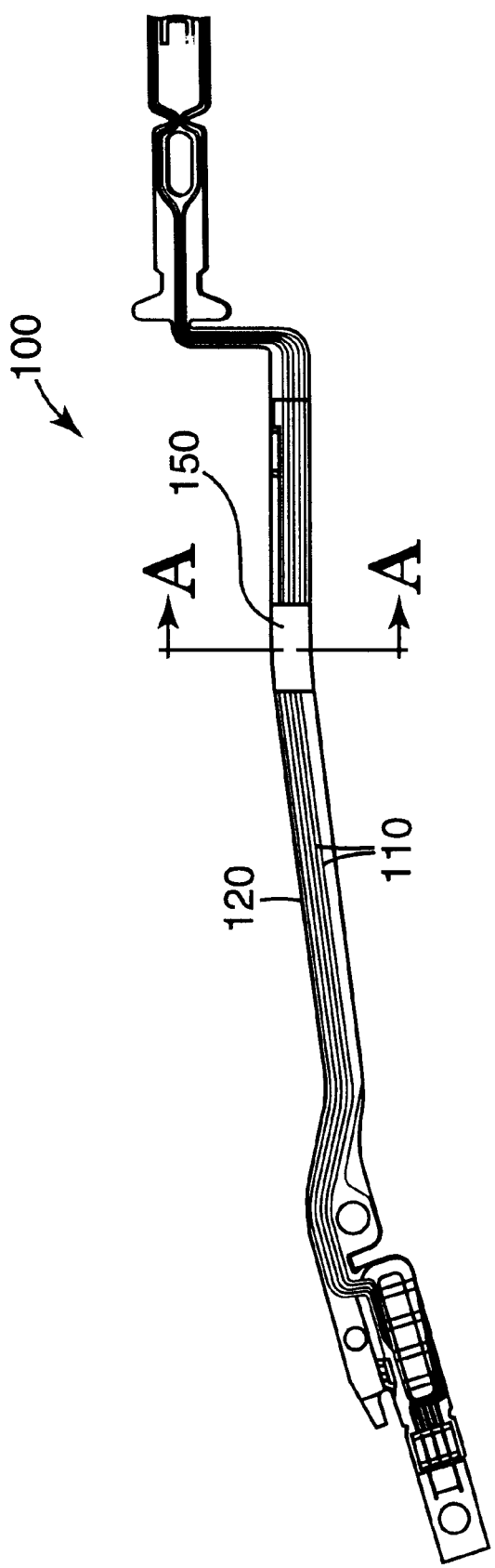
FIG. 1 is a top plan view of a flexible circuit for use in a hard disk drive and featuring a conductive polymer strip in accordance with the present invention.

As noted hereinabove, several different solutions have been proposed to provide enhanced ESD protection for MR heads used in HDD applications. These solutions include twisted conductor leads, shorting bars and other techniques suitable for use in an MR head assembly using wire leads. Many of these solutions are either significantly more difficult or impossible to implement in assemblies where the conductive wire leads have been replaced by a flexible circuit to reduce the assembly weight or to improve manufacturability.

Tribocharging of the dielectric substrate materials used in flexible circuit manufacture may be a significant source of energy for MR head damage. If a static surface charge is generated it could be discharged through the MR head. Enough energy can be passed to the MR head in this manner to destroy the material balance and to significantly reduce the sensing properties. By way of example only, for a typical surface voltage of 200 V and typical MR head resistances of 20–80 ohm, currents of 0.5–1.4 amps for 2–5 nanoseconds have been measured and determined to be sufficient to melt the MR layers.

The MR element in a slider is very susceptible to damage by short duration energy pulses such as those delivered during an electrostatic discharge (ESD) event. Tribocharging results primarily from the relative motion of two surfaces, one of which is a dielectric. While the surfaces are in contact, equilibrium between surface layer electronic potential rapidly develops. When the surfaces of dissimilar materials are parted, whatever changes in surface charge occurred to create the equilibrium remain on the surfaces, often having potentials of several hundred volts. This occurs often as the slider is assembled into a head gimbal assembly (HGA), the precision carrier for the MR slider in a hard disk drive.

The rate at which the surfaces re-establish a neutral state depends in the dielectric (or electron mobility) properties of the material. Materials with high surface and bulk resistance, namely insulators, tend to retain charge for long periods. Substrate materials used in HDD applications usually have very high dielectric properties since volatile impurities may damage the HDD over time.

A static surface charge may be dissipated by local atmospheric conditions such as high humidity. In fact, many antistatic materials (often applied as coatings) rely on the attraction of water molecules to increase charge mobility of the coating surface or bulk properties. However, in HDD applications, such coating materials are not suitable since the interior of the HDD must have minimal reactive materials, such as moisture.

Another approach is to use air ionizers to provide balanced amounts of negative and positive ions flooding the statically charged surfaces. In this approach, if a potential exists, the opposite polarity ions will hopefully be attracted and the like polarized ions repelled, thus, creating zero potential at the surface. Experience shows that the charge decay with ionizers can be ten seconds or more to reach 10 volts or less. However, the handling operations during HGA assembly, where tribocharging can occur, often have 2–5 second cycle times. Waiting for full charge neutralization at each operation would be uneconomical.

Figure 2:
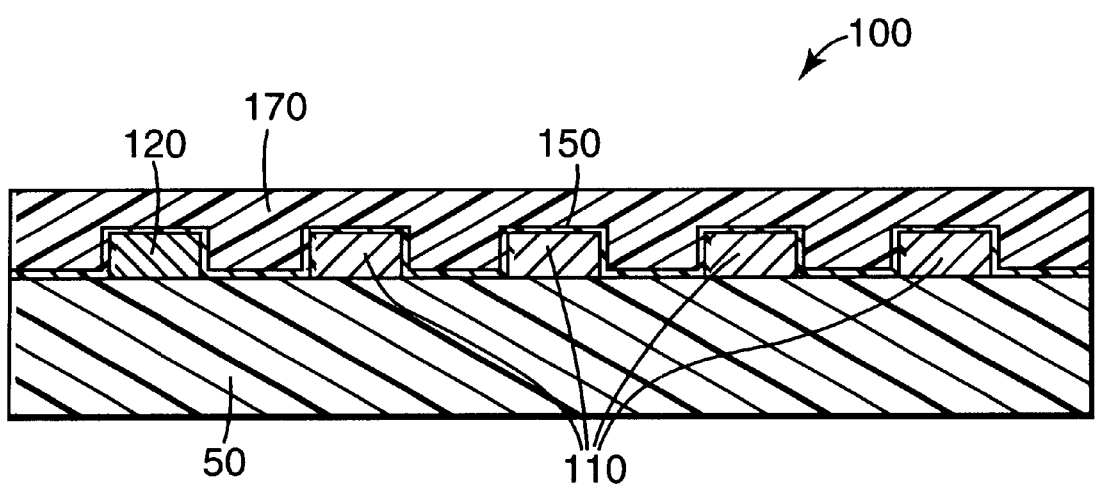
FIG. 2 is a cross-section view of the flexible circuit of FIG. 1 taken along section line A—A.
Figure 3:
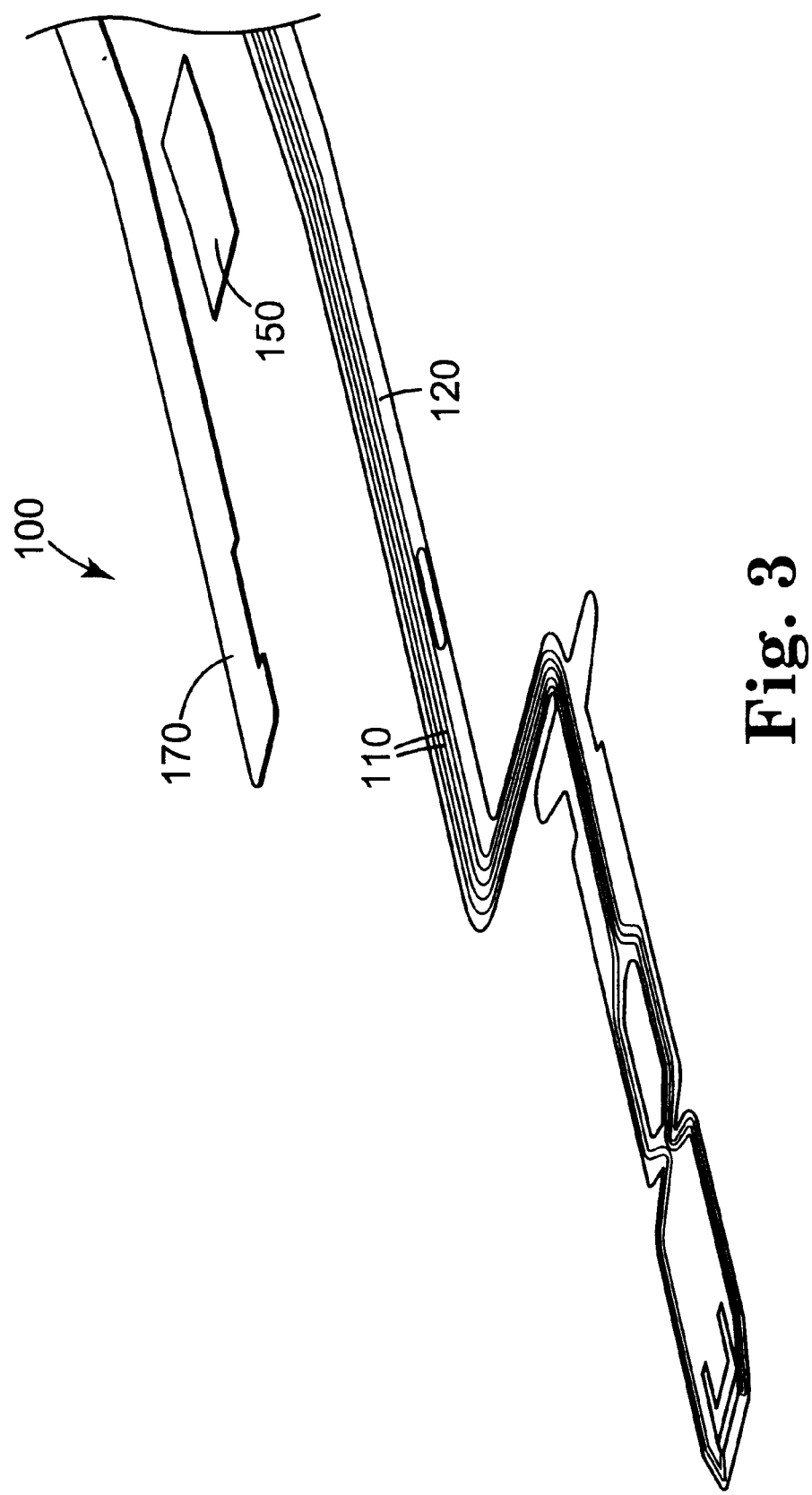
FIG. 3 is an exploded perspective view of a portion of the flexible circuit of FIG. 1 illustrating the multi-layer structure of the present invention.

Referring now to FIGS. 1–3, one embodiment of the present invention solves this ESD problem by forming a permanent, high resistance, conductive polymer strip which acts as an electrical shunt 150 built into the flexible circuit 100 to provide a path that will equalize the static charge voltage between all leads 110 before discharge occurs. When discharge does occur, the shunt 150 continues to moderate the degree of charge imbalance. The rapid ESD event commonly results from tribocharge voltage from test instruments discharging into one lead 110 of the flexible circuit 100 which is connected to the MR element while the opposite MR lead is grounded. As ESD occurs, the voltage divides and crosses the shunt 150 and starts pulling the voltage on the other leads 110 up or down before the peak voltage reaches the MR head. This has the effect of reducing the peak potential across the head. Additionally, a ground lead 120 may be incorporated into the flexible circuit 100 and connected by the polymer strip or shunt 150 to all of the read/write leads 110 to further minimize the static electric potential.

Since the shunt 150 is a permanent part of the flexible circuit, it must not interfere with the performance of the HGA during its lifetime of operation. Accordingly, the shunt is designed to function independently of the dielectric substrate and may be adjusted to provide specific trace-to-trace resistance values. Measurements using a time domain reflectometer (TDR) show that the impedance of the circuit at operating frequencies are not affected by the presence of the conductive strip having a shunt resistance value in the range of about $10^4$ to about $10^9$ ohms. Impedance is determined by a combination of conductor shape, as well as any coupling to surrounding conductive elements and the surrounding material dielectric properties. It is the inventor's belief that the lack of detection of the conductive polymer strip by TDR is due to the thinness of the strip, its polymeric nature and its high resistance value. Testing has shown that the conductive polymer strip should preferably have a thickness of about 0.5–2.0 μm as thicker strips of about 6.0 μm will tend to show up on the TDR.

The shunt 150 consists of a polymeric material that is conductive. Most conductive polymers are loaded with conductive media such as metal or carbon powders at a high weight ratio needed to achieve "percolation" or electron conductivity. However, one preferred conductive polymer that may be used in the strip conducts through the existence of unterminated radicals. Electrons under low voltage stress migrate rapidly through the polymer material. Control of the conductive strip material formulation and application process provides the desired range of conductivities between traces, reducing the trace-to-trace resistance from a range of about about $10^{13}$ to $10^{16}$ ohms to a range of about $10^4$ to about $10^9$ ohms, and preferably a range of about $0.5 \times 10^6$ to $1.5 \times 10^6$ ohms. With current MR heads this resistance range provides the required protection to the MR head.

One preferred polymer film material is in a liquid suspension containing a very high percentage vehicle, conductive polymer and a film forming polymer. In one particular embodiment, about 10–90 wt % of an aqueous dispersion of 1.3 wt % conductive polymer such as BAYTRON P (poly-3,4-ethylenedioxythiophene complexed with polystyrene sulfonate) available from Bayer Corporation of Pittsburgh, Pa. is combined with about 10–90 wt % of an aqueous dispersion of 45.5% nonionic self crosslinking acrylic binder resin such as RHOPLEX HA-16 (acrylic water base adhesive) available from Rohm and Haas Co. of Philadelphia, Pa. to render a conductive polymer material. The pH of the mixture is adjusted from about 3.0 to between about 7.0 and about 8.5 with the addition of about 0.1–1.0 wt % of a 50% ammonium hydroxide ($NH_4OH$) solution. A more preferred blend composition includes about 65–85 wt % of BAYTRON P, about 15–35 wt % RHOPLEX HA-16, and about 0.1–1.0 wt % of $NH_4OH$ solution.

An alternative conductive polymer film material may be produced by adding carbon black, about 0.5–1.5 wt %, to a conventional solder mask material, e.g., epoxy acrylates and the like, to make it semi-conductive. One such material which has proven effective is NPR-5/ESD-10 available from Nippon Polytech Corporation of Tokyo, Japan.

One skilled in the art will observe that a number of alternative polymer blend combinations may be used to produce an ESD protected flexible circuit in accordance with the present invention. Additionally, changes in polymer strip geometry including thickness, length and width may be used to vary the resulting static dissipative properties. However, the conductive polymer and geometry selected must be capable of producing an electrical shunt having the desired trace-to-trace resistance of about $10^4$ to $10^9$ ohms.

Once the conductive polymer blend has been prepared, it may be applied in a discrete pattern on the flexible circuit by various methods including, by way of example only, inkjet printing, screen printing, pad printing, syringe dispensing, and the like. Transfer printing techniques, namely screen printing and pad printing, are preferred in that they tend to produce more uniform strip thickness in a repeatable manner.

Figure 4:
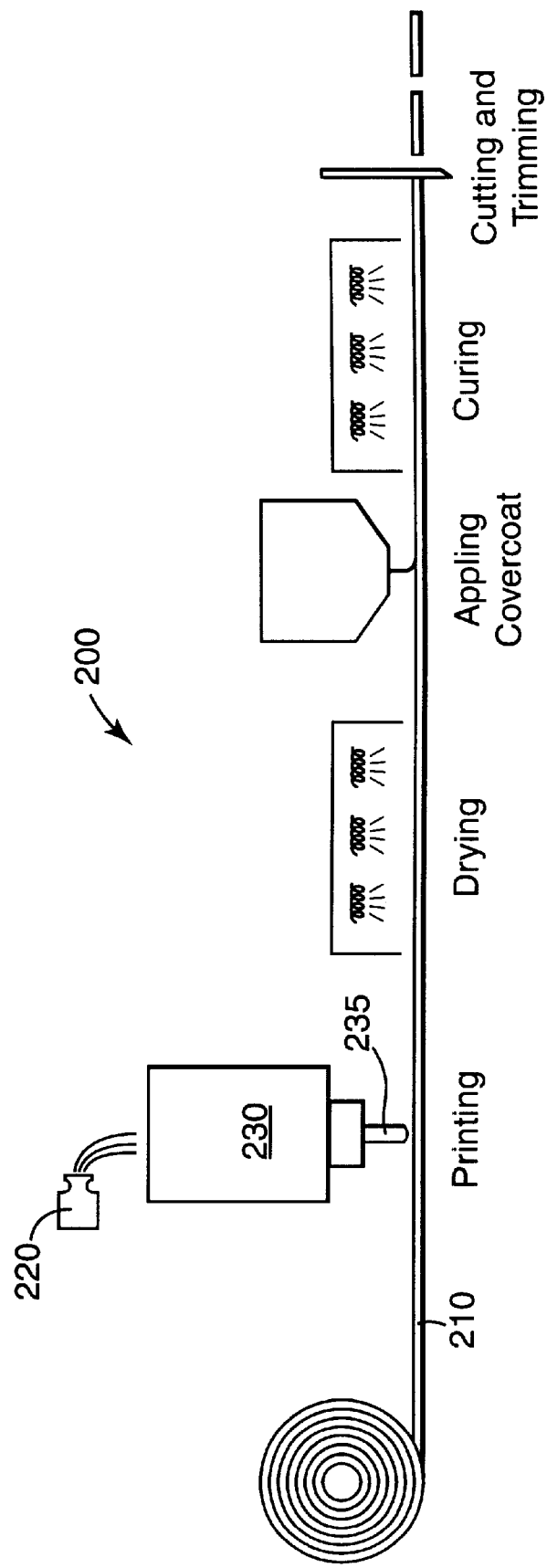
FIG. 4 is a schematic diagram of the method of making a flexible circuit in accordance with the present invention.

One method which has provided consistent results utilizes a commercial pad printing machine such as an INKPRINT 50 PN available from Comec USA of Manchester Village, Vt. This type of machine is commonly used to print labels on golf balls. Turning now to FIG. 4, and with reference back to FIG. 1–3, a process 200 may involve the step of first providing a roll of prepared flexible circuit material 210 made by forming a conductive layer on a dielectric polymer substrate 50 and etching it to produce a number of discrete conductive traces 110. A conductive polymer blend 220 is prepared and placed in the ink well, not shown, of the printing machine 230. As flexible circuit material 210 is advanced into the printer 230, the print head 235 is loaded up with the conductive polymer "ink" 220 and subsequently stamps a conductive polymer strip 150 transversely across the conductive leads 110 of a number of flexible circuits 100 at one time. This step is than repeated at prescribed intervals. After printing, the flexible circuit material is then dried using IR lamps or heated air to drive off the carrier liquid at a film temperature of about 100–150° C. Subsequetly, a dielectric cover coat 170, as shown in FIGS. 2–3, may be applied to the flexible circuit material 210 and cured at about 150° C. for about 30 minutes. At the same time, the conductive polymer will crosslink to make a permanent shunt 150 that adheres well to the substrate material 50 of the flex circuit 100, usually polyimide (PI). The process is then completed by cutting the individual flexible circuits 100 from the sheet of printed and cured flexible circuit material 210.

It should be noted that the conductive polymer strip is somewhat ionic in nature and during ionic contamination testing does still contribute ionic materials to the test results. This would normally preclude the use of these materials in HDD components including flexible circuits for MR head connections. However, the subsequent application of a low ionic covercoat material reduces the ionic contaminants introduced by the conductive polymer strip by a factor of about 100 depending on the strip and circuit configuration.

In short, the shunt 150 is intended to be common to all of the conductive leads 110 providing a trace-to-trace resistance between them of about $10^4$ to $10^9$ ohms. The shunt 150 consists of a conductive polymer film, which is applied across all the leads 110 on of the flexible circuit 100 to be used in the HGA. Then it is covered with the dielectric covercoat 170, e.g., an epoxy acrylate having a resistivity of about $10^{13}$ ohms. Thus, the conductive polymer strip 150 may be completely encapsulated between the dielectric substrate 50 and the dielectric covercoat 170 but in intimate contact with the conductive circuit traces 110.

Although the present invention has been particularly shown and described with reference to the preferred embodiments thereof, it will understood by those skilled in the art that various changes in form and detail may be made therein without departing from the spirit and the scope of the invention. Accordingly, the present invention is not limited to the particular embodiments disclosed herein, but rather by the claims attached hereto.

What is claimed is:

1. A flexible circuit, comprising:
   a dielectric substrate;
   a conductive layer on a surface of the dielectric substrate, the conductive layer patterned to define a plurality of spaced apart conductive elements; and
   a conductive polymer strip in contact with and extending between at least two of the conductive elements, the conductive polymer strip forming an electrical shunt between the at least two conductive elements.

2. The flexible circuit of claim 1, wherein the electrical shunt has a resistance of about $10^4$ ohms to about $10^9$ ohms.

3. The flexible circuit of claim 2, wherein the electrical shunt has a resistance of about $0.5 \times 10^6$ ohms to about $1.5 \times 10^6$ ohms.

4. The flexible circuit of claim 1, wherein the conductive polymer strip further comprises 10–90 wt % of an aqueous dispersion of about 1.3 wt % conductive polymer, 10–90 wt % of an aqueous dispersion of about 45.5 wt % nonionic self crosslinking acrylic binder resin, and 0.1–1.0 wt % aqueous solution of about 50 wt % ammonium hydroxide.

5. The flexible circuit of claim 4, wherein the conductive polymer in the aqueous dispersion is a blend of polyethylenedioxythiophene and polystyrenesulfonate.

6. The flexible circuit of claim 1, wherein the conductive polymer strip exhibits optical clarity.

7. The flexible circuit of claim 1, further comprising an insulating polymer cover coat layer encapsulating the conductive polymer strip.

* * * * *